(12) United States Patent
Okada

(10) Patent No.: US 10,991,908 B2
(45) Date of Patent: Apr. 27, 2021

(54) LIGHT-EMITTING DEVICE AND LIGHT-EMITTING SYSTEM

(71) Applicant: PIONEER CORPORATION, Tokyo (JP)

(72) Inventor: Takeru Okada, Kawasaki (JP)

(73) Assignee: PIONEER CORPORATION, Kawasaki (JP)

( * ) Notice: Subject to any disclaimer, the term of this patent is extended or adjusted under 35 U.S.C. 154(b) by 287 days.

(21) Appl. No.: 16/082,234

(22) PCT Filed: Mar. 4, 2016

(86) PCT No.: PCT/JP2016/056833
§ 371 (c)(1),
(2) Date: Sep. 4, 2018

(87) PCT Pub. No.: WO2017/149771
PCT Pub. Date: Sep. 8, 2017

(65) Prior Publication Data
US 2020/0295298 A1    Sep. 17, 2020

(51) Int. Cl.
*H01L 51/52* (2006.01)
*H01L 27/32* (2006.01)

(52) U.S. Cl.
CPC .......... *H01L 51/5253* (2013.01); *H01L 27/32* (2013.01); *H01L 51/5203* (2013.01)

(58) Field of Classification Search
CPC ............. H01L 51/5253; H01L 51/5256; H01L 51/5203; H01L 51/5206; H01L 51/5221;
(Continued)

(56) References Cited

U.S. PATENT DOCUMENTS 8,319,419 B2    11/2012   Kodama et al.
9,865,835 B2    1/2018    Shinjo et al.
(Continued)

FOREIGN PATENT DOCUMENTS

JP    2011-023336 A    2/2011
JP    2013-200964 A    10/2013
(Continued)

OTHER PUBLICATIONS

International Search Report for related International Application No. PCT/JP2016/056833, dated May 31, 2016; 2 pages.
(Continued)

*Primary Examiner* — Tucker J Wright
(74) *Attorney, Agent, or Firm* — Procopio, Cory, Hargreaves & Savitch LLP

(57) ABSTRACT

A light-emitting unit (140) is formed on a substrate (100), and includes a light-transmitting first electrode (110), a light-reflective second electrode (130), and an organic layer (120) located between the first electrode (110) and the second electrode (130). A light-transmitting region is located between a plurality of light-emitting units (140). An insulating film (150) defines an end (142) of the light-emitting unit (140). A sealing member (200) is fixed to the light-emitting unit (140) directly or through an adhesive layer (210). In addition, a thickness of the substrate (100) is d, and a width of a portion of the second electrode (130) that is further on the outer side of the light-emitting unit (140) than the end (142) is W, $d/2 \leq W$ is established.

9 Claims, 12 Drawing Sheets

(58) Field of Classification Search
CPC ............. H01L 51/5209; H01L 51/5225; H01L 51/5271; H01L 51/0097; H05B 33/26
See application file for complete search history.

(56) References Cited

U.S. PATENT DOCUMENTS

| | | | |
|---|---|---|---|
| 10,418,591 B2 * | 9/2019 | Harada | ............... F21V 21/0808 |
| 2010/0314616 A1 | 12/2010 | Kodama et al. | |
| 2015/0340642 A1 | 11/2015 | Shinjo et al. | |
| 2017/0294626 A1 | 10/2017 | Aoki et al. | |

FOREIGN PATENT DOCUMENTS

| | | |
|---|---|---|
| JP | 2014-154566 A | 8/2014 |
| JP | 2016-062767 A | 4/2016 |
| WO | 2015181869 A1 | 12/2015 |
| WO | 2016-042638 A1 | 3/2016 |

OTHER PUBLICATIONS

Office Action for related JP App. No. 2019173920 dated Sep. 10, 2020. English translation provided; 5 pages.

* cited by examiner

LIGHT-EMITTING DEVICE AND LIGHT-EMITTING SYSTEM

CROSS-REFERENCE TO RELATED APPLICATIONS

This application is a U.S. National Stage entry of PCT Application No: PCT/JP2016/056833 filed Mar. 4, 2016, the contents of which are incorporated herein by reference.

TECHNICAL FIELD

The present invention relates to a light-emitting device and a light-emitting system.

BACKGROUND ART

In recent years, there has been progress in the development of light-emitting devices using organic EL. Such light-emitting devices are used as illumination devices or display devices and configured of an organic layer interposed between a first electrode and a second electrode. Generally, a transparent material is used for the first electrode, and a metal material is used for the second electrode.

One of the light-emitting devices which utilizes the organic EL is a technology described in Patent Document 1. In order to provide a display device using organic EL with optical transparency (or a "see-through" property), the technology in Patent Document 1 provides second electrodes only in a portion of a pixel. In such a configuration, since a region located between a plurality of second electrodes transmits light, the display device is capable of having optical transparency. Meanwhile, in the technology described in Patent Document 1, a light-transmitting insulating film is formed between the plurality of second electrodes to define the pixel. In Patent Document 1, an inorganic material such as silicon oxide and a resin material such as acrylic resin are exemplified as materials of the insulating film.

RELATED ART DOCUMENT

Patent Document

[Patent Document 1]: Japanese Unexamined Patent Application Publication No. 2011-23336

SUMMARY OF THE INVENTION

In a light-emitting device of a light-transmitting type in which light is desired to be extracted only from one surface (a front surface), there is a case where a portion of the light leaks out also from a surface of the opposite side (a rear surface). In this case, visually recognizing the opposite side from the rear surface side through the light-emitting device may become difficult, and a light extraction efficiency on the front surface may decrease.

An example of the problem to be solved by the present invention is to reduce a leakage of light from a surface opposite to a light-emitting surface in a light-transmitting-type light-emitting device.

Means for Solving the Problem

The invention described in claim 1 is a light-emitting device including:
a light-transmitting substrate;
a plurality of light-emitting units formed on the substrate, each light-emitting unit including a light-transmitting first electrode, a light-reflective second electrode, and an organic layer located between the first electrode and the second electrode;
a light-transmitting region located between the plurality of light-emitting units; and
an insulating film that defines an end of the light-emitting unit,
in which a sealing member is fixed to the light-emitting unit directly or through an adhesive layer, and
in which when the thickness of the substrate is d and the width of a portion of second electrode which is located further on the outer side of the light-emitting unit than the end is W, $d/2 \leq W$ is established.

The invention described in claim 9 is a light-emitting system including:
a partition member that partitions a space from an exterior;
a light-transmitting substrate disposed on the partition member;
a plurality of light-emitting units formed on one surface of the substrate, each light-emitting unit including a light-transmitting first electrode, a light-reflective second electrode, and an organic layer located between the first electrode and the second electrode;
a light-transmitting region located between the plurality of light-emitting units;
an insulating film that defines an end of the light-emitting unit; and
a covering film that directly covers the light-emitting unit, the insulating film, and the substrate in the light-transmitting region,
in which when the thickness of the substrate is d and the width of a portion of the second electrode which is located further on the outer side of the light-emitting unit than the end is W, $d/2 \leq W$ is established.

BRIEF DESCRIPTION OF THE DRAWINGS

The objects described above, and other objects, features and advantages are further made apparent by a suitable embodiment that will be described below and the following accompanying drawings.

DESCRIPTION OF EMBODIMENT

Figure 1:
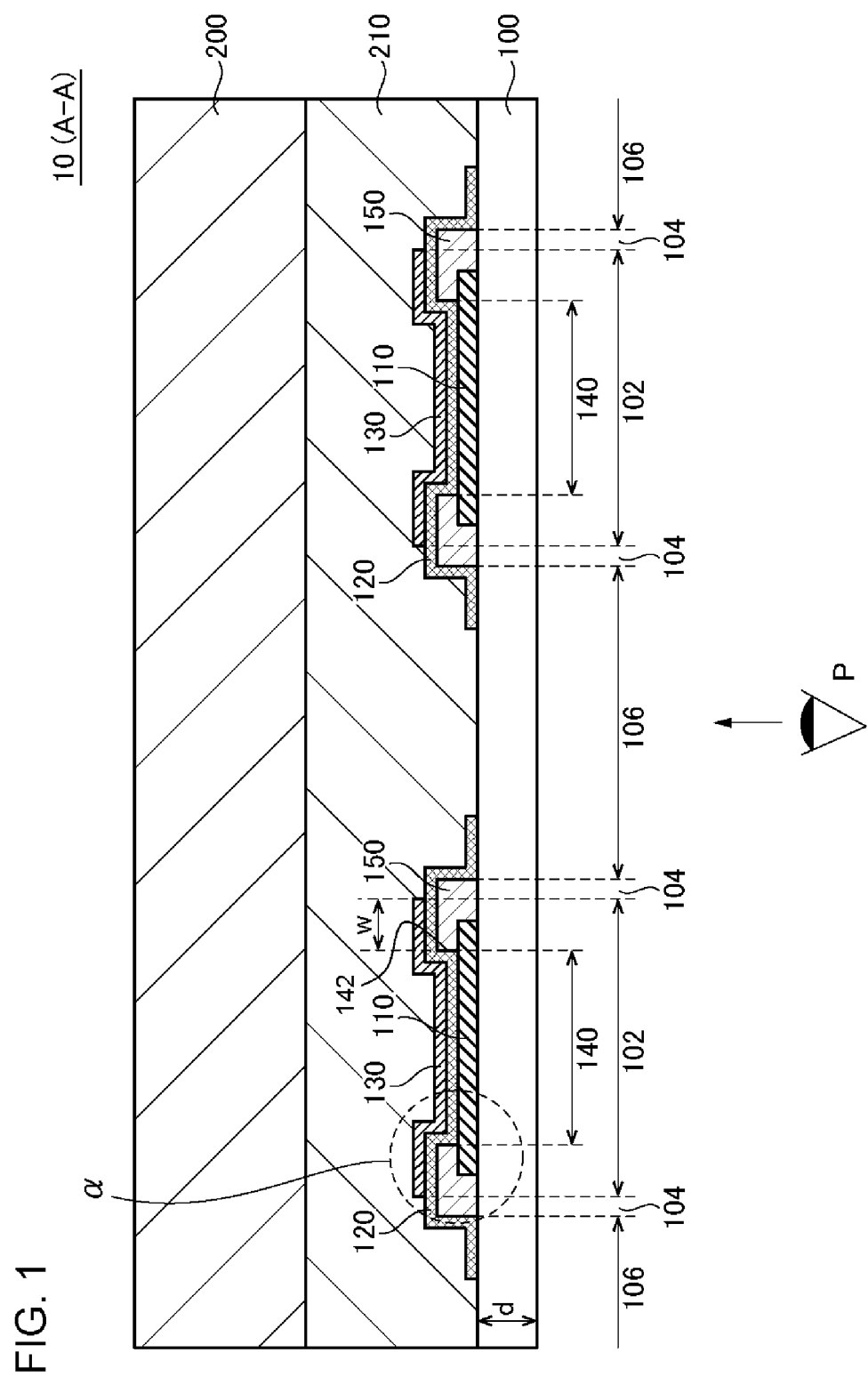
FIG. 1 is a cross-sectional view of a configuration example of a light-emitting device according to an embodiment.

An embodiment of the present invention will be described below by referring to the drawings. Moreover, in all the drawings, the same constituent elements are given the same reference numerals, and descriptions thereof will not be repeated.

Figure 2:
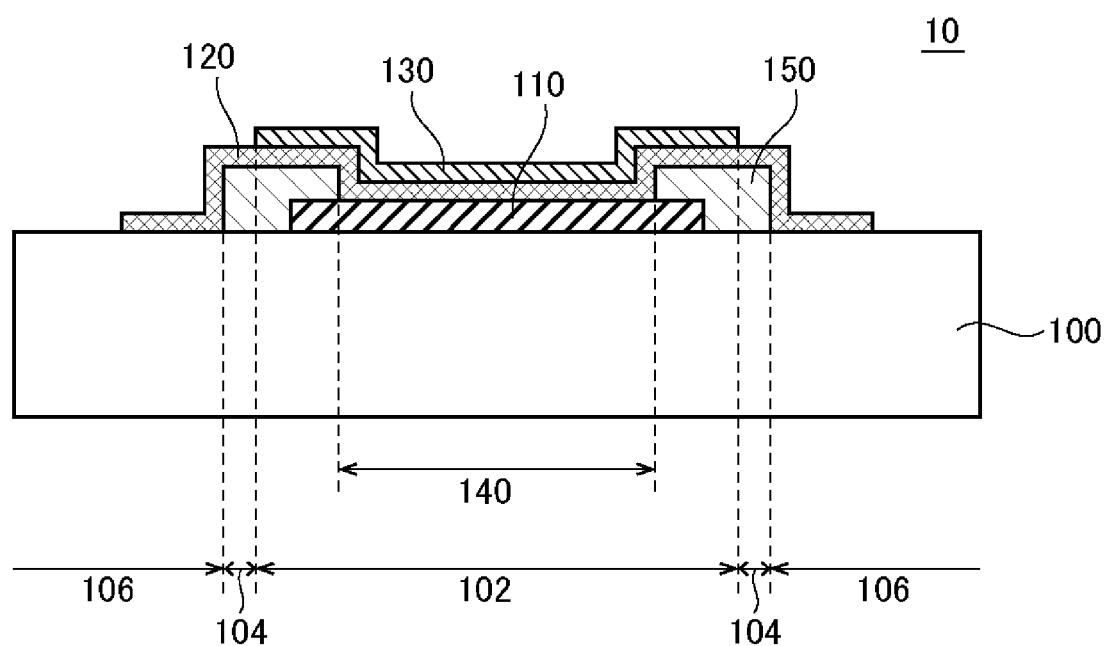
FIG. 2 is an enlarged view of a light-emitting unit in a light-emitting device.

FIG. 1 is a cross-sectional view showing a configuration example of a light-emitting device 10 according to an embodiment. A person P is viewing a light-emitting surface of the light-emitting device 10 from a direction perpendicular to a substrate 100 in FIG. 1. FIG. 2 is an enlarged view of a light-emitting unit 140 in the light-emitting device 10. The light-emitting device 10 according to the embodiment is a lighting device or a display device. FIG. 1 and FIG. 2 show a case where the light-emitting device 10 is a lighting device.

The light-emitting device 10 includes a light-transmitting substrate 100, a plurality of light-emitting units 140, a light-transmitting region, and an insulating film 150. The light-emitting units 140 are formed on the substrate 100, each light-emitting unit 140 including a light-transmitting first electrode 110, a light-reflective second electrode 130, and an organic layer 120 located between the first electrode 110 and the second electrode 130. The light-transmitting region is located between the plurality of light-emitting units 140. The insulating film 150 defines an end 142 of the light-emitting unit 140. The sealing member 200 is fixed to the light-emitting unit 140 directly or with an adhesive layer 200 interposed therebetween. Further, when the thickness of the substrate 100 is d and the width of a portion of the second electrode 130 which is further on the outer side of the light-emitting unit 140 than the end 142 is W, d/2≤W is established. A detailed description will be provided below.

Meanwhile, in the descriptions below, based on the light-emitting unit 140, a side on which the substrate 100 is provided is called a front surface of the light-emitting device 10, and a side on which the sealing member 200 is provided is called a rear surface of the light-emitting device 10.

In the present embodiment, the light-emitting device 10 is a lighting device, and includes the substrate 100, the plurality of light-emitting units 140, and the insulating layer 150. A light-transmitting material is used for the substrate 100. The plurality of the light-emitting units 140 are separated from each other, each including the first electrode 110, the organic layer 120, and the second electrode 130. The first electrode 110 is a light-transmitting electrode, and the second electrode 130 has light shielding properties or light reflectivity. The first electrode 110 and the second electrode 130 are at least partially overlapped. However, a portion of a region in which the second electrode 130 is formed may also be a light-transmitting electrode. The organic layer 120 is located between the first electrode 110 and the second electrode 130. The insulating layer 150 covers an edge of the first electrode 110. Moreover, at least a portion of the insulating layer 150 is not covered by the second electrode 130. Meanwhile, the second electrode 130 may cover the entirety of the insulating film 150.

Further, when viewed in a direction perpendicular to the substrate 100, the light-emitting device 10 includes a first region 102, a second region 104, and a third region 106 (a light-transmitting region). The first region 102 overlaps the second electrode 130. That is, when viewed in the direction perpendicular to the substrate 100, the first region 102 is a region which is covered by the second electrode 130. In a case where the second electrode 130 includes reflectivity, the first region 102 does not transmit light either from a front surface to a rear surface or from the rear surface to the front surface of the light-emitting device 10 or the substrate 100. The second region 104 is not covered by the second electrode 130 but overlaps the insulating film 150. The third region 106 is neither covered by the second electrode 130 nor overlapped by the insulating film 150, and is light-transmitting. In addition, since the width of the second region 104 is narrower than that of the third region 106, the light-emitting device 10 has sufficient optical transparency. Meanwhile, the second region 104 and the third region 106 may form the light-transmitting region.

The substrate 100 is polygonal, for example, rectangular, or round. In a case where the substrate 100 is a resin substrate, the substrate 100 is formed using, for example, polyethylene naphthalate (PEN), polyether sulphone (PES), polyethylene terephthalate (PET), or polyimide. A refractive index n of the substrate 100 is not particularly limited, but is, for example, equal to or greater than 1.5. In addition, in a case where the substrate 100 is a resin substrate, an inorganic barrier film of $SiN_x$, SiON, or the like is preferably formed on at least one surface (preferably, both surfaces) of the substrate 100 in order to prevent moisture from permeating the substrate 100. Further, an optical film such as an antireflective film may be provided on at least one surface of the substrate 100. In this case, as described later, a thickness including the inorganic barrier film and the optical film may be defined as the thickness d of the substrate 100.

The light-emitting unit 140 is formed on one surface of the substrate 100. The light-emitting unit 140 has a configuration in which the first electrode 110, the organic layer 120, and the second electrode 130 are laminated in this order. In a case where the light-emitting device 10 is a lighting device, the plurality of light-emitting units 140 are linearly extended. On the other hand, in a case where the light-emitting device 10 is a display device, the plurality of light-emitting units 140 may be disposed to constitute a matrix or may be disposed to constitute segments or to display a predetermined shape (for example, an icon). Further, the plurality of light-emitting units 140 are formed in accordance with each pixel.

The first electrode 110 is a transparent electrode having optical transparency. A material of the transparent electrode contains a metal, for example, a metal oxide such as an indium tin oxide (ITO), an indium zinc oxide (IZO), an indium tungsten zinc oxide (IWZO), a zinc oxide (ZnO), or the like. The thickness of the first electrode 110 is, for example, equal to or greater than 10 nm and equal to or less than 500 nm. The first electrode 110 is formed by, for example, sputtering or vapor deposition. Meanwhile, the first electrode 110 may be a conductive organic material such as carbon nanotubes or PEDOT/PSS. In the drawing, a plurality of the first electrodes 110 are linearly formed in parallel to each other on the substrate 100. Therefore, the first electrode 110 is located neither in the second region 104 nor in the third region 106. Meanwhile, since the first electrode 110 is a transparent electrode having optical transparency, it may be located in the second region 104 and the third region 106.

Further, an auxiliary electrode (not shown in the drawing) may be provided in the first electrode 110. In this case, the auxiliary electrode is formed of a material having a lower resistance value than that of the first electrode 110 and in contact with the first electrode 110. The auxiliary electrode is formed using, for example, at least one metal layer. In addition, the auxiliary electrode is covered by the insulating film 150. Therefore, the auxiliary electrode is not directly connected to any of the organic layer 120 and the second electrode 130. The auxiliary electrode is provided, thereby lowering the apparent resistance value of the first electrode 110.

The organic layer 120 includes a light-emitting layer. The organic layer 120 has a configuration in which, for example, a hole injection layer, a light-emitting layer, and an electron injection layer are laminated in this order. A hole transport layer may be formed between the hole injection layer and the light-emitting layer. In addition, an electron transport layer may be formed between the light-emitting layer and the electron injection layer. The organic layer 120 may be formed using vapor deposition. In addition, at least one layer of the organic layer 120, for example, a layer which is in contact with the first electrode 110, may be formed using a coating method such as ink jetting, printing, or spraying. Meanwhile, in this case, the remaining layers of the organic layer 120 are formed using vapor deposition. In addition, all layers of the organic layer 120 may be formed using a coating method.

The second electrode 130 includes a metal layer constituted of a metal selected from a first group consisting of, for example, Al, Au, Ag, Pt, Mg, Sn, Zn, and In, or an alloy of metals selected from the first group. In this case, the second electrode 130 has light shielding properties. The thickness of the second electrode 130 is, for example, equal to or greater than 10 nm and equal to or less than 500 nm. However, the second electrode 130 may be formed using a material exemplified as the material of the first electrode 110. The second electrode 130 is formed using, for example, sputtering or vapor deposition. In the example shown in the drawing, the light-emitting device 10 includes a plurality of linear second electrodes 130. Each second electrode 130 is provided for each first electrode 110, and the width of each second electrode 130 is wider than that of each first electrode 110. Therefore, when viewed from a direction perpendicular to the substrate 100, the entire first electrode 110 is overlapped and covered by the second electrode 130 in the width direction. In addition, the width of the first electrode 110 may be wider than that of the second electrode 130, and when viewed from a direction perpendicular to the substrate 100, the second electrode 130 may be entirely covered by the first electrode 110 in the width direction. Further, the second electrode 130 may cover the entirety of the insulating film 150, and the second electrode 130 may be provided to spread to a region in which neither the first electrode 110 nor the insulating layer 150 are formed.

The edge of the first electrode 110 is covered by the insulating layer 150. The insulating layer 150 is formed of a photosensitive resin material such as, for example, polyimide, and surrounds a portion of the first electrode 110, the portion serving as the light-emitting unit 140. An edge of the second electrode 130 in the width direction is located over the insulating film 150. In other words, when viewed from a direction perpendicular to the substrate 100, a portion of the insulating layer 150 protrudes from the second electrode 130. In addition, in the example illustrated in the drawing, the organic layer 120 is formed on top and side of the insulating layer 150. However, the organic layer 120 is divided in a region between the light-emitting units 140 next to each other. Further, in a case where the organic layer 120 has light-transmitting properties, the organic layer 120 need not be divided between the light-emitting units 140 next to each other.

As described above, the light-emitting device 10 includes the first region 102, the second region 104, and the third region 106. The first region 102 overlaps the second electrode 130. The second region 104 is a region which is not covered by the second electrode 130 but overlaps the insulating film 150. In the example illustrated in the drawing, the organic layer 120 is also formed in the second region 104. The third region 106 is a region which is not covered by the second electrode 130 and does not overlap with the second electrode 130. In the example shown in the drawing, the organic layer 120 is not formed in at least a portion of the third region 106. In addition, the width of the second region 104 is narrower than that of the third region 106. Moreover, the width of the third region 106 may be wider or narrower than that of the first region 102. In a case where the width of the first region 102 is 1, the width of the second region 104 is, for example, equal to or greater than 0 (or more than 0) and equal to or less than 0.2, and the width of the third region 106 is, for example, equal to or greater than 0.3 and equal to or less than 2. In addition, the width of the first region 102 is, for example, equal to or greater than 50 µm and equal to or less than 500 µm, and the width of the second region 104 is, for example, equal to or greater than 0 µm (or more than 0 µm) and equal to or less than 100 µm, and the width of the third region 106 is, for example, equal to or greater than 15 µm and equal to or less than 1,000 µm.

Further, the light-emitting device 10 may be provided with a covering film which directly covers the light-emitting unit 140, the insulating film 150, and the substrate 100 in the light-transmitting region. The covering film is, for example, the adhesive layer 210 or a later-described sealing member.

The sealing member 200 covers the light-emitting unit 140 and the insulating film 150, and is fixed to the light-emitting unit 140 directly or through an adhesive layer. A space (a layer made of a material other than a solid) is not interposed between the light-emitting unit 140 and the sealing member 200. The sealing member 200 and the adhesive layer 210 have light-transmitting properties. The present drawing shows an example of the sealing member 200 being fixed through the adhesive layer 210 to the light-emitting unit 140. When the sealing member 200 is fixed through the adhesive layer 210 to the light-emitting unit 140, the sealing member 200 is formed by, for example, glass, or a light-transmitting thin plate (or foil) such as a barrier film. In addition, the edge of the sealing member 200 is fixed using an adhesive or the like to the substrate 100. Thereby, a space for housing the light-emitting unit 140 is formed between the sealing member 200 and the substrate 100. Further, this space is filled by an adhesive such as an epoxy. In this case, the adhesive layer 210 is configured by the adhesive. In the example in the drawing, the second electrode 130 is in contact with the adhesive layer 210, and in addition, is in contact with the sealing member 200.

On the other hand, in a case where the sealing member 200 is directly fixed to the light-emitting unit 140, the sealing member 200 is formed by directly sealing over the substrate 100 by, for example, resin. In addition, the sealing member 200 is in contact with the second electrode 130. In this case, the thickness of the sealing member 200 is not particularly limited, however, for example, is equal to or greater than 20 μm and equal to or less than 300 μm.

Figure 3:
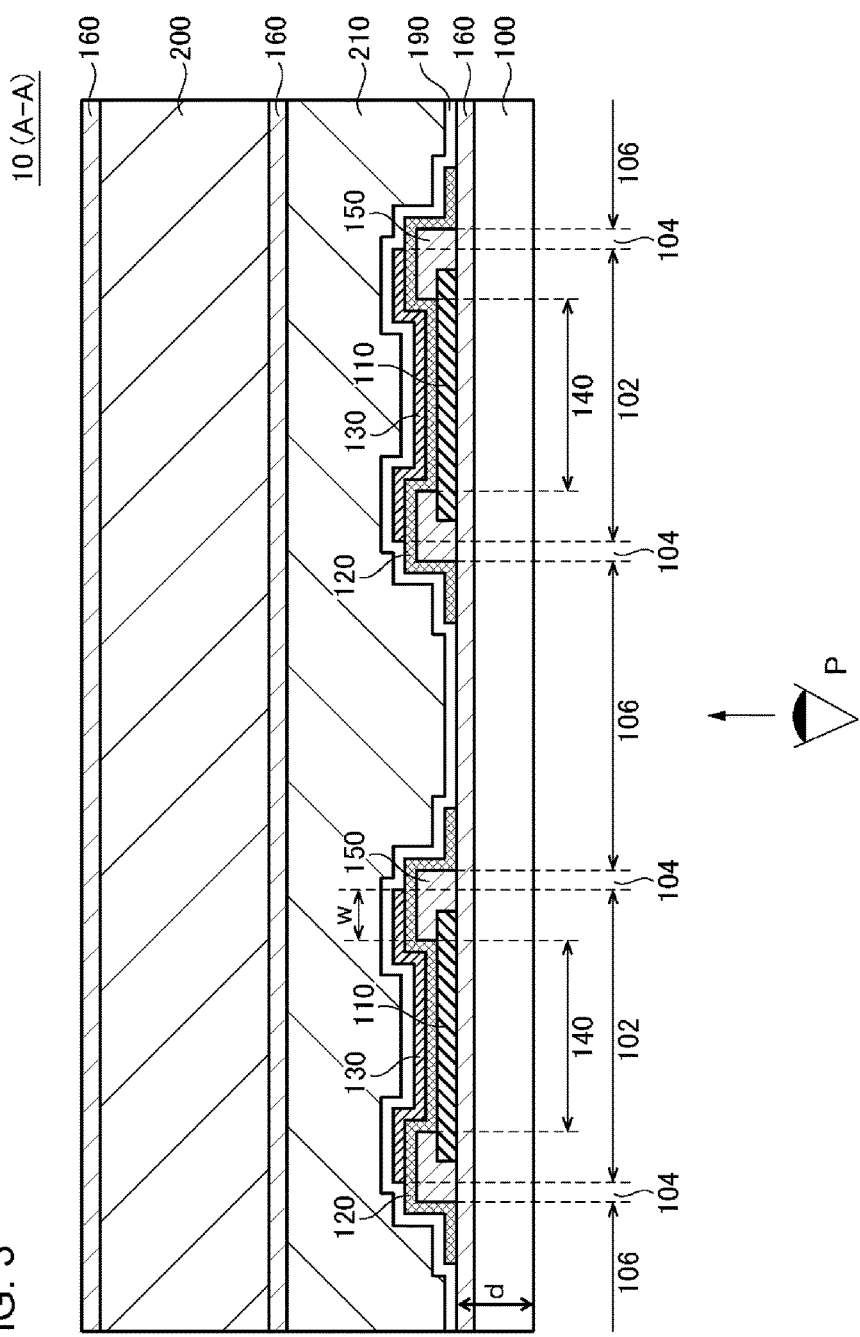
FIG. 3 is a cross-sectional view of another configuration example of a light-emitting device according to an embodiment.

FIG. 3 is a cross-sectional view of another configuration example of the light-emitting device 10. The present drawing corresponds to the above-mentioned FIG. 1. In the example shown in the drawing, a sealing film 190 is formed between the light-emitting unit 140 and the adhesive layer 210 as a covering film. In addition, a barrier film 160 is additionally formed between the substrate 100 and the first electrode 110, between the light-emitting unit 140 and the sealing member 200, and on the side of the sealing member 200 opposite to the light-emitting unit 140. Further, the light-emitting unit 140 is covered by the sealing film 190 and the barrier film 160. In the example shown in the drawing, the sealing member 200 is fixed to the light-emitting unit 140 with the barrier film 160, the sealing film 190, and the adhesive layer 210 interposed therebetween.

The sealing film 190 is formed on the surface of the substrate 100 on which at least the light-emitting unit 140 is formed to cover the light-emitting unit 140. In the example shown in the drawing, the sealing film 190 is in contact with the second electrode 130. The sealing film 190 is formed by, for example, an insulating material, more specifically, an inorganic material such as an aluminum oxide or an titanium oxide. Further, the thickness of the sealing film 190 is preferably equal to or less than 300 nm. In addition, the thickness of the sealing film 190 is, for example, equal to or greater than 50 nm.

The sealing film 190 is formed by, for example, ALD (Atomic Layer Deposition). In this case, high step coverage of the sealing film 190 is obtained. Further in this case, the sealing film 190 may have a multilayer structure in which plural layers are laminated. In this case, the sealing film 190 may be configured by repeatedly laminating a first sealing layer composed of a first material (for example, aluminum oxide), and a second sealing layer composed of a second material (for example, titanium oxide). The lowermost layer may be any of the first sealing layer and the second sealing layer. The uppermost layer may also be any of the first sealing layer and the second sealing layer. In addition, the inorganic film 190 may be a single layer in which the first material and the second material are mixed.

However, the sealing film 190 may be formed using another film formation method, for example, CVD or sputtering. In this case, the sealing film 190 is formed of an insulating film such as $SiO_2$ or SiN or the like, and the thickness thereof is, for example, equal to or greater than 10 nm and equal to or less than 1,000 nm.

The barrier film 160 is formed by, for example, ALD, CVD, or sputtering. The barrier film 160 is formed of an insulating film such as $Al_2O_3$, $SiO_2$, SiN, and $Si_3N_4$, and the thickness thereof is, for example, equal to or greater than 50 nm and equal to or less than 5,000 nm. Further, the barrier film 160 may have a multilayer structure in which multiple layers are laminated. The multilayer structure may include, for example, an organic planarization layer.

Meanwhile, in the example shown in the drawing, one or more of a plurality of barrier films 160 and the sealing film 190 may be omitted. Further, in a case where the sealing member 200 is formed on the sealing film 190 in contact therewith, the sealing film 190 together with the sealing member 200 may be considered as a sealing member. In this case, it can be said that the sealing member is directly fixed on the light-emitting unit 140.

Figure 4:
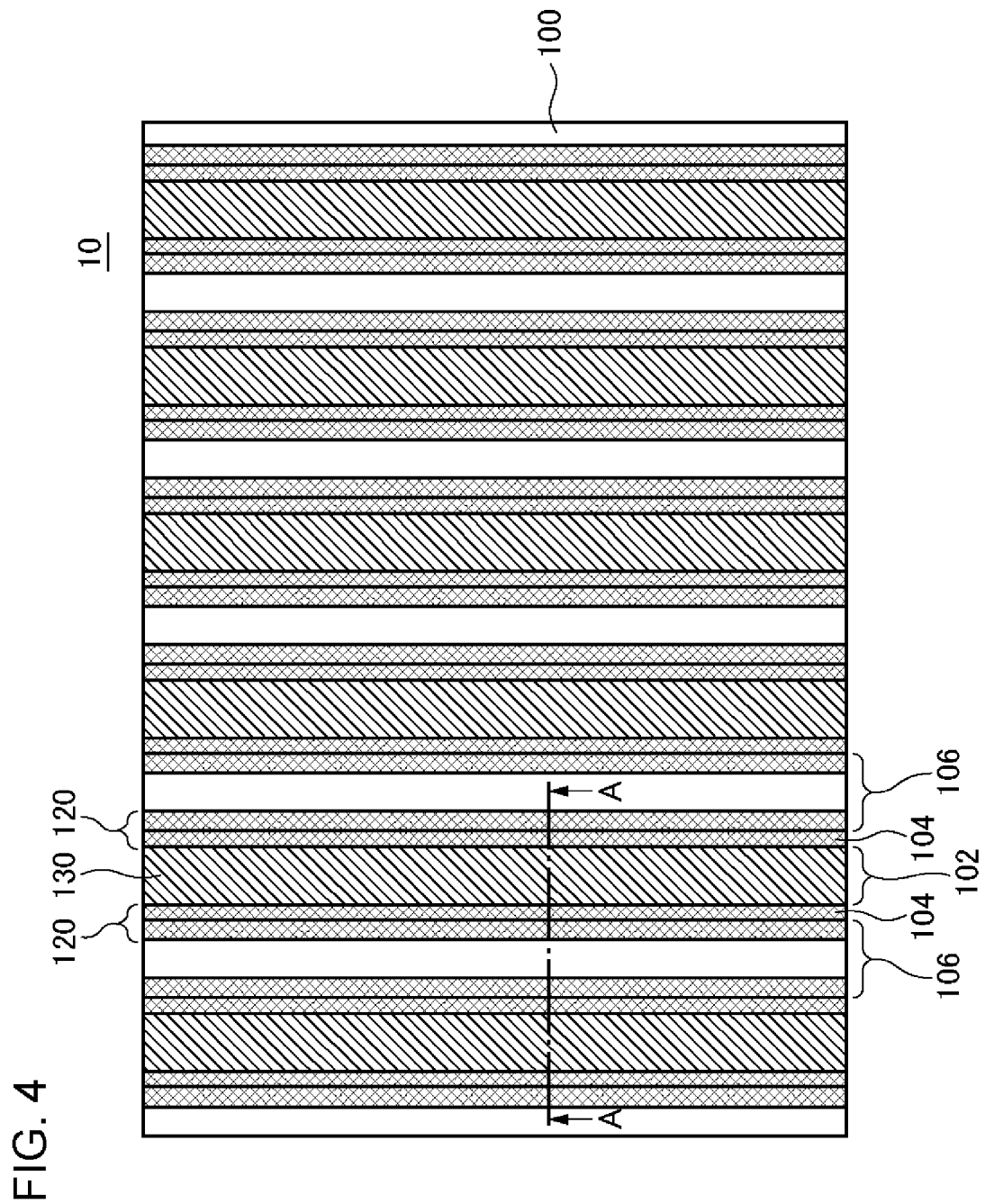
FIG. 4 is a plan view of a light-emitting device.

FIG. 4 is a plan view of the light-emitting device 10. Meanwhile, FIG. 1 corresponds to a cross-section taken along line A-A of FIG. 4. In the example shown in the drawing, the plurality of the light-emitting units 140 extend in the same direction as each other when viewed from a direction perpendicular to the substrate 100. Further, each of the first region 102, the second region 104, and the third region 106 extends linearly and in the same direction as each other. In addition, as shown in the drawing and FIG. 1, the second region 104, the first region 102, the second region 104, and the third region 106 are repeatedly aligned in this order. Meanwhile, the direction perpendicular to the substrate 100 is a direction perpendicular to the main surface of the substrate 100.

Figure 5:
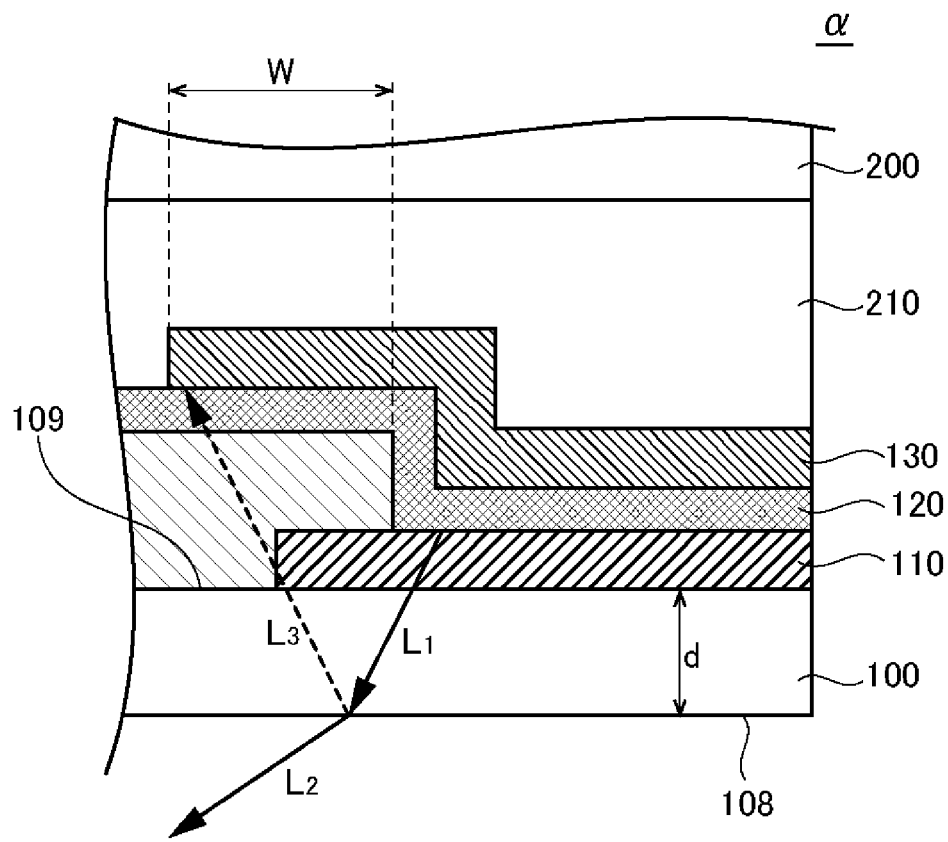
FIG. 5 is an enlarged view of a region of FIG. 1 surrounded by a dotted line α.

FIG. 5 is an enlarged view of a region of FIG. 1 surrounded by a dotted line α. A rear surface 109 of the substrate 100 is a surface on the side facing the second region 104, and a front surface 108 of the substrate 100 is a surface on the opposite side to the side facing the second region 104. An arrow $L_1$ in the drawing shows an example of a light path which is taken by light emitted from the light-emitting unit 140 advancing toward the front surface 108 of the substrate 100. Further, an arrow $L_2$ shows a route of light which is refracted and emitted to the outside of the light-emitting device 10 out of the light which has reached the front surface 108 of the substrate 100. In addition, a dotted arrow $L_3$ shows a route of light which is reflected on an interface of air and the substrate 100 and advances to the rear surface side of the light-emitting device 10.

Here, when the refractive index of the substrate 100 is n, in a case where an incident angle is greater than a critical angle $\theta_c$, light is totally reflected. Meanwhile, when the refractive index of the substrate 100 is n, the critical angle $\theta_c = \arcsin(1/n)$ is established. Such totally-reflected light is emitted from the end without being extracted from either the front surface or the rear surface when the surface of the substrate 100 is flat and light is not scattered. Therefore, the light will not leak from the rear surface. On the other hand, a portion of light having an incident angle which is smaller than the critical angle $\theta_c$ is extracted as emitted light, and another portion is regularly reflected at the same angle. When this regularly reflected light $L_3$ reaches the sealing member 200 or the adhesive layer 210, a portion thereof is emitted to the outside of the light-emitting device 10 and then leaks from the rear surface.

When light becomes incident on the surface of the substrate 100 from the front, that is, when an incident angle θ is 0 degrees, a ratio R of an intensity of regular reflection to an intensity of incident light is $R=((n-1)/(n+1))^2$ by Snell's law. For example, when the substrate 100 is glass having a refractive index of n=1.5, the ratio R is approximately 4%. This ratio R becomes greater as the incident angle θ becomes larger in accordance with Fresnel's law. Thus, even when the ratio R of the regular reflection is several percent, an influence to light leaked from the rear surface must be considered. This is because the regular reflection on the rear surface 109 is also only several percent and a greater portion of the regularly reflected light on the front surface 108 directly becomes light leaked from the rear surface.

In the light-emitting device 10 according to the present embodiment, as described above, a relationship of d/2≤W is established between the thickness d of the substrate 100 and the width W of a portion of the second electrode 130 on the further on the outer side of the light-emitting unit 140 than the end 142 (hereinafter called "the overlapping region"). Therefore, approximately equal to or more than 30% of the regularly reflected light on the front surface 108 is reflected again in the overlapping region to the front surface 108 side, and it is possible to reduce the light leaked from the rear surface.

Here, W is the width of a portion of the second electrode 130 which is further on the outer side of the light-emitting unit 140 than the end 142 in a cross section (which corresponds to a cross-section taken along line A-A in FIG. 4) which is perpendicular to both the surface of the substrate 100 and an extending direction of the light-emitting unit 140. In addition, it can also be said that the width W is the shortest distance between an end of the light-emitting unit 140 and an end of the second electrode 130. Meanwhile, the thickness d of the substrate 100 may be defined as a distance between a surface of the first electrode 110 facing the substrate 100 and a surface of the substrate 100 or a surface of the substrate 100 and a layer laminated thereon exposed to a gas phase. That is, in a case where a barrier layer, the optical film, or the like is laminated on at least one surface of the substrate 100, the thickness including the barrier layer or the optical film can be considered as the thickness d.

In addition, in the light-emitting device 10, it is more preferable that $d \times \tan(\arcsin(1/n)) \leq W < 3d \times \tan(\arcsin(1/n))$ is satisfied.

Figure 6:
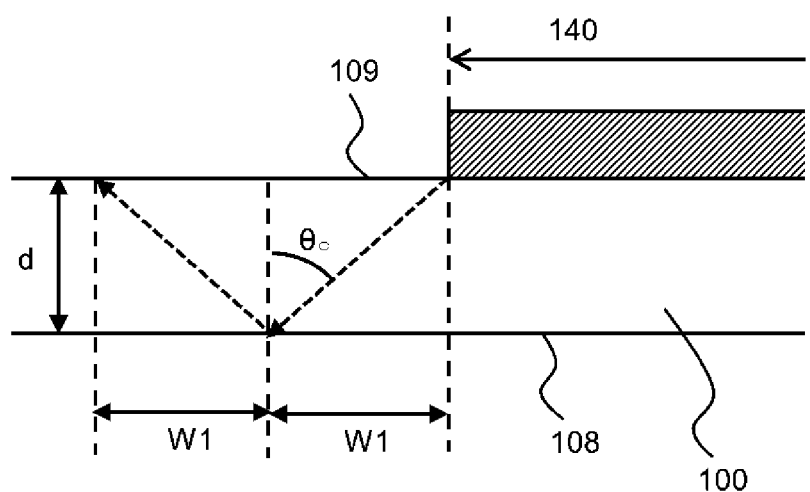
FIG. 6 is a view of an example of a light path in a substrate of light emitted from a light-emitting unit.

FIG. 6 is a diagram of an example of the light path in the substrate 100, of the light emitted from the light-emitting unit 140. In the diagram, the light-emitting unit 140 is illustrated in a simplified way. Further, in the present drawing, a dotted arrow shows the light path of light which is totally reflected on the interface of the substrate 100 and air. In addition, a length shown as $W_1$ in the drawing is $d \times \tan(\arcsin(1/n))$. That is, $W_1 = d \times \tan\theta_c$ is established, and since the critical angle is $\theta_c = \arcsin(1/n)$, $W_1 = d \times \tan(\arcsin(1/n))$ is established. Meanwhile, it can be said that $W_1$ is a distance which is advanced by light incident on the interface between the substrate 100 and the air at the critical angle in an in-plane direction of the substrate 100 from the rear surface 109 to the front surface 108 through the substrate 100. Further, as shown in the diagram, light from the light-emitting unit 140 reaches within the range of a distance of $2 \times W_1$ from the end of the light-emitting unit 140, that is, a distance of $2d \times \tan(\arcsin(1/n))$. Thus, by establishing $d \times \tan(\arcsin(1/n)) \leq W$, approximately equal to or more than 50% of the regularly reflected light is reflected again in the overlapping region to the front surface 108 side, and thus it is possible to further reduce the light leaked from the rear surface. Meanwhile, by establishing $W < 3d \times \tan(\arcsin(1/n))$, optical transparency of the light-emitting device 10 is prevented from becoming impaired. Meanwhile, here, the thickness of the first electrode 110 or the thickness of the insulating film 150 is sufficiently small with respect to the thickness d of the substrate 100 and can be ignored.

In the light-emitting device 10, it is more preferable that $2d \times \tan(\arcsin(1/n)) \leq W < 3d \times \tan(\arcsin(1/n))$ is satisfied. When the above is satisfied, almost all of the regularly reflected light having an angle smaller than the critical angle is reflected again in the overlapping region to the front surface 108 side, and it is possible to still further reduce light leaked from the rear surface. Meanwhile, the optical transparency of the light-emitting device 10 is prevented from becoming impaired.

Meanwhile, in a case where one or more layers of a barrier layer and the like are laminated on at least one surface of the substrate 100, the layer(s) and the substrate may be considered together as a substrate composed of a plurality of layers. In this case, the refractive index of the thickest layer of the plurality of layers can be set as the refractive index n of the substrate. Further, a mean value of the plurality of layers may also be set as the refractive index n of the substrate. At least in one of the case where the refractive index of the thickest layer of the plurality of layers is set as the refractive index n, and the case where the mean value of the plurality of layers is set as n, it is more preferable that $d \times \tan(\arcsin(1/n)) \leq W < 3d \times \tan(\arcsin(1/n))$ is satisfied, and it is even more preferable that $2d \times \tan(\arcsin(1/n)) \leq W < 3d \times \tan(\arcsin(1/n))$ is satisfied.

Meanwhile, in FIG. 1 and FIG. 2, an example was shown in which the widths W of the overlapping regions located on the right and the left with respect to one light-emitting unit 140 are the same. However, at least apart of the widths W of the plurality of overlapping regions with respect to one light-emitting unit 140 may be different in size. In addition, in FIG. 1 and FIG. 2, an example is illustrated of a case where all of the widths W of the overlapping regions with respect to the plurality of the light-emitting units 140 are the same, but at least a part of the widths W of the overlapping regions of the plurality of the light-emitting units 140 may be different in size. In a case where there are plurality of overlapping regions having widths W in different sizes, it is sufficient if the largest width W satisfies $d/2 \leq W$. In addition, it is more preferable that the smallest width W satisfies a relationship of $d/2 \leq W$.

The substrate 100 is a substrate, such as, for example, a glass substrate or a resin substrate which has optical transparency. The substrate 100 may have flexibility. In a case where the substrate has flexibility, the thickness d of the substrate 100 is, not particularly limited, but, for example, equal to or greater than 10 μm and equal to or less than 1,000 μm. Particularly, the thickness d of the substrate 100 is preferably equal to or less than 100 μm. When the thickness d of the substrate 100 is equal to or less than 100 μm, even in a case where $d/2 \leq W$ is satisfied, the overlapping region does not become too large, and thereby it is possible to secure satisfactory optical transparency of the light-emitting device 10.

Next, a method of manufacturing the light-emitting device 10 will be described. First, the first electrode 110 is formed on the substrate 100 by, for example, sputtering. Then, the first electrode 110 is formed in a predetermined pattern by, for example, photolithography. Meanwhile, before forming the first electrode 110, the inorganic barrier film may be formed on the surface of the substrate 100 by sputtering or the like.

The insulating layer 150 is then formed over an edge of the first electrode 110. For example, in a case where the insulating layer 150 is formed of a photosensitive resin, the insulating layer 150 is formed in a predetermined pattern by undergoing exposure and development steps. Next, the organic layer 120 and the second electrode 130 are formed in this order. In a case where the organic layer 120 includes a layer formed by vapor deposition, this layer is formed in a predetermined pattern using a mask or the like. The second electrode 130 is also formed in a predetermined pattern using, for example, a mask. Thereafter, the light-emitting unit 140 is sealed using the sealing member 200.

According to the embodiment, $d/2 \leq W$ is established between the thickness d of the substrate 100 and the width W of a portion of the second electrode 130 which is located further on the outer side of the light-emitting unit 140 than the end 142. Therefore, it is possible to reduce the light leaked from the rear surface by further reflecting reflected light from the surface of the substrate 100 on the second electrode 130 to the substrate 100 side.

Modification Example 1

Figure 7:
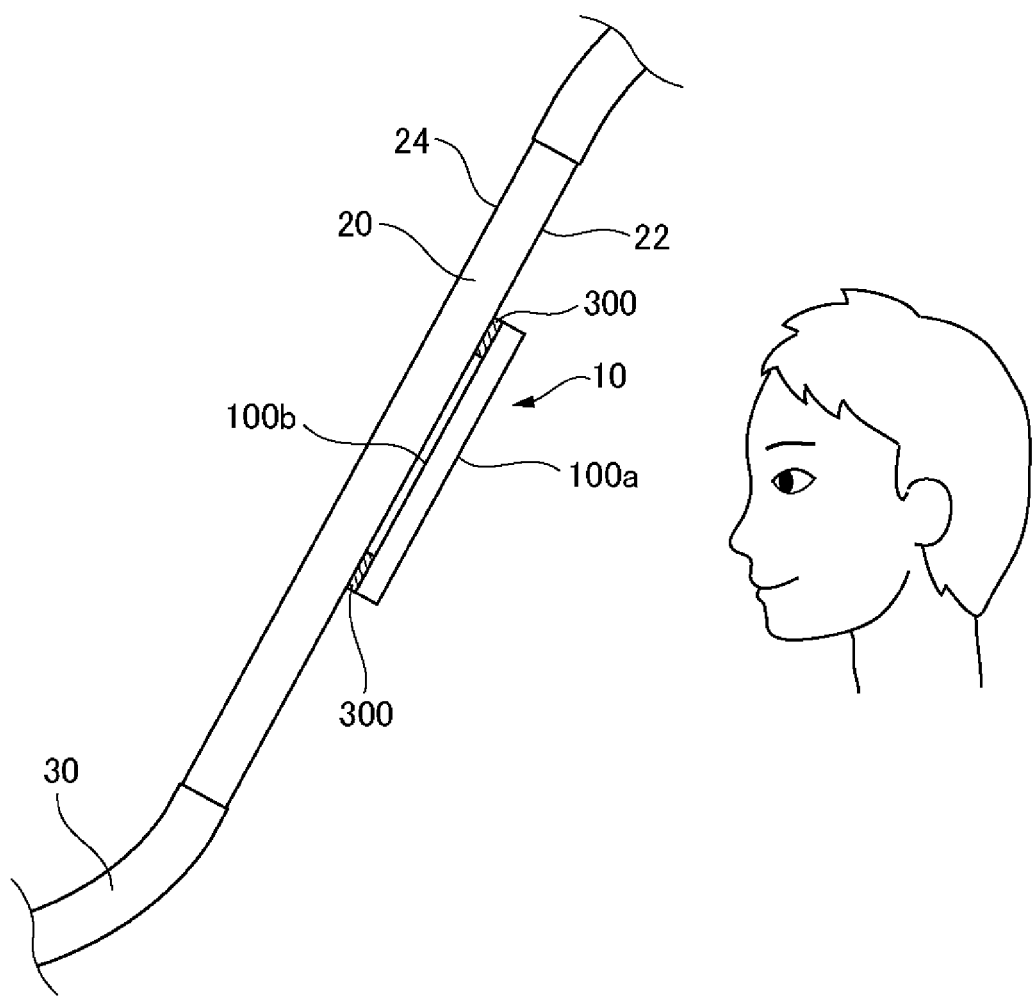
FIG. 7 is a cross-sectional view of a configuration example of a light-emitting system according to Modification Example 1.

FIG. 7 is a cross-sectional view of a configuration example of a light-emitting system according to Modification Example 1. This light-emitting system includes the afore-mentioned light-emitting device 10 and a partition member 20. Specifically, the light-emitting system includes a light-transmitting partition member 20, a light-transmitting substrate 100, a plurality of light-emitting units 140, a light-transmitting region, an insulating film 150, and a covering film. The partition member 20 partitions a space from the outside. The substrate 100 is disposed on the partition member 20. The light-emitting unit 140 is formed on one surface of the substrate 100. Further, the light-emitting unit 140 includes a light-transmitting first electrode 110, a light-reflective second electrode 130, and an organic layer 120 located between the first electrode 110 and the second electrode 120. The light-transmitting region is located between the plurality of light-emitting units 140. The insulating film 150 defines an end 142 of the light-emitting unit 140. The covering film directly covers the light-emitting unit 140, the insulating film 150, and the substrate 100 in the light-transmitting region. In addition, when the thickness of the substrate 100 is d and the width of a portion of the second electrode 130 which is further on the outer side of the light-emitting unit 140 than the end 142 is W, $d/2 \leq W$ is established. A detailed description will be provided below.

The partition member 20 has optical transparency and partitions a space from the exterior thereof. This space is, for example, a space occupied by a person, or a space having an object such as a commercial product disposed therein. The light-emitting device 10 includes the same configuration as that of the above-mentioned embodiment. In the example shown in the drawing, a surface of the substrate 100 on the side provided with the light-emitting unit 140 (a first surface 100a) is directed toward the space occupied by a person.

The partition member 20 is, for example, a window of a mobile object 30 for transporting a person, or a window of a showcase, and is formed using glass or a light-transmitting resin. The mobile object 30 is, for example, an automobile, a train, or an airplane. In a case where the mobile object 30 is an automobile, the partition member 20 is a windshield, a rear windshield, or a side window (for example, a door window) installed at the side of a seat. In a case where the partition member 20 is a rear windshield, the plurality of light-emitting units 140 function as, for example, a brake light. In addition, in a case where the partition member 20 is a windshield or a rear windshield, the plurality of light-emitting units 140 may be a turn signal light. In addition, the partition member 20 may be a window for partitioning the interior and the exterior of a room such as a meeting room. The light-emitting system may allow to distinguish whether the meeting room is occupied, depending on the lighting/non-lighting of the light-emitting units 140.

Further, a second surface 100b of the light-emitting device 10 is fixed to the inner surface (a first surface 22) of the partition member 20 through an adhesive layer 300. Here, the second surface 100b is a surface on the opposite side of the first surface 100a, and a surface on a light extraction side. Therefore, light emitted from the light-emitting unit 140 of the light-emitting device 10 is emitted to the exterior of the above-mentioned space (for example, the mobile object 30) through the partition member 20. Further, the light-emitting device 10 has optical transparency. Therefore, a person can view the exterior and the interior of the space through the partition member 20. For example, a person located inside the mobile object 30 can visually recognize the outside of the mobile object 30 through the partition member 20.

The adhesive layer 300 fixes the light-emitting device 10 to the partition member 20. Insofar as a material fulfilling such a function is used, there is no particular limitation to the material of the adhesive layer 300. In the present modification example, a portion (for example, two sides facing each other) of the second surface 100b of the substrate 100 is fixed to the first surface 22 of the partition member 20 with the adhesive layer 300 interposed therebetween. Therefore, an air gap is formed between the substrate 100 and the first surface 22. Even in such a case, $d/2 \leq W$ is established in the light-emitting device 10 between the thickness d of the substrate 100 and the width W in the overlapping region, thereby further reflecting reflected light from a surface of the substrate 100 on the second electrode 130 to a side of the substrate 100. Thus, it is possible to reduce light leaked from the rear surface.

Modification Example 2

Figure 8:
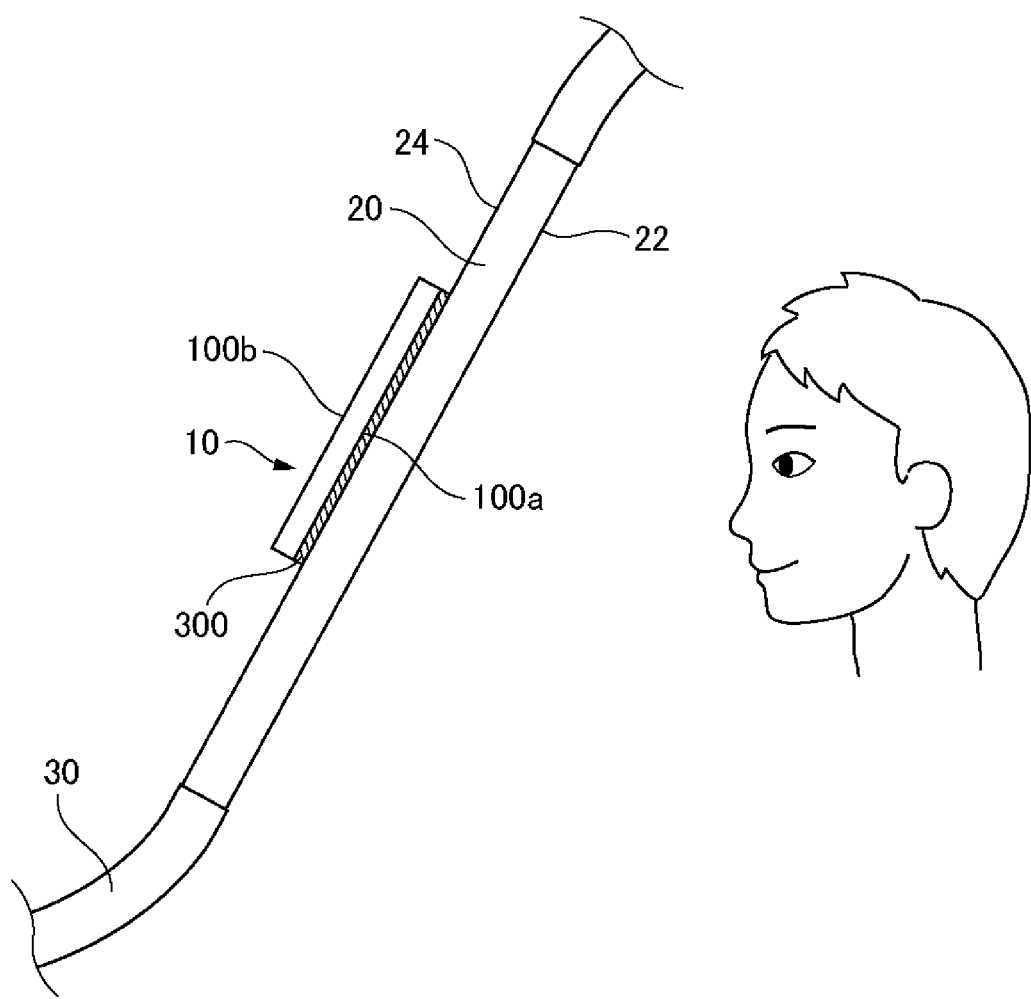
FIG. 8 is a cross-sectional view of a configuration example of a light-emitting system according to Modification Example 2.

FIG. 8 is a cross-sectional view of a configuration example of a light-emitting system according to Modification Example 2. The light-emitting system according to the present modification example has the same configuration as that of the light-emitting system according to Modification Example 1, except that a light-emitting device 10 is mounted on the partition member 20 on an outer surface (a second surface 24) of the mobile object 30.

The light-emitting device 10 according to the present modification example has the same configuration as that of the above-mentioned embodiment. However, in the light-emitting device 10, a surface thereof on the opposite side of the partition member 20 serves as a light extraction surface. In order to achieve such a configuration, a surface of the light-emitting device 10 on a first surface 100a side may be made to face the partition member 20.

In the present modification example also, the same as the embodiment, it is possible to reduce light leaked from a rear surface.

In addition, light emitted from the light-emitting device 10 is emitted directly to the exterior of the mobile object 30 without passing through the partition member 20. Therefore, compared to Modification Example 1, a person who is outside the mobile object 30 can easily recognize the light from the light-emitting device 10. In addition, since the light-emitting device 10 is installed on the exterior of the mobile object 30, that is, on the partition member 20 on the second surface 24 side, it is possible to prevent the emitted light from the light-emitting device 10 from being reflected on the partition member 20 and entering the interior of the mobile object 30.

Modification Example 3

Figure 9:
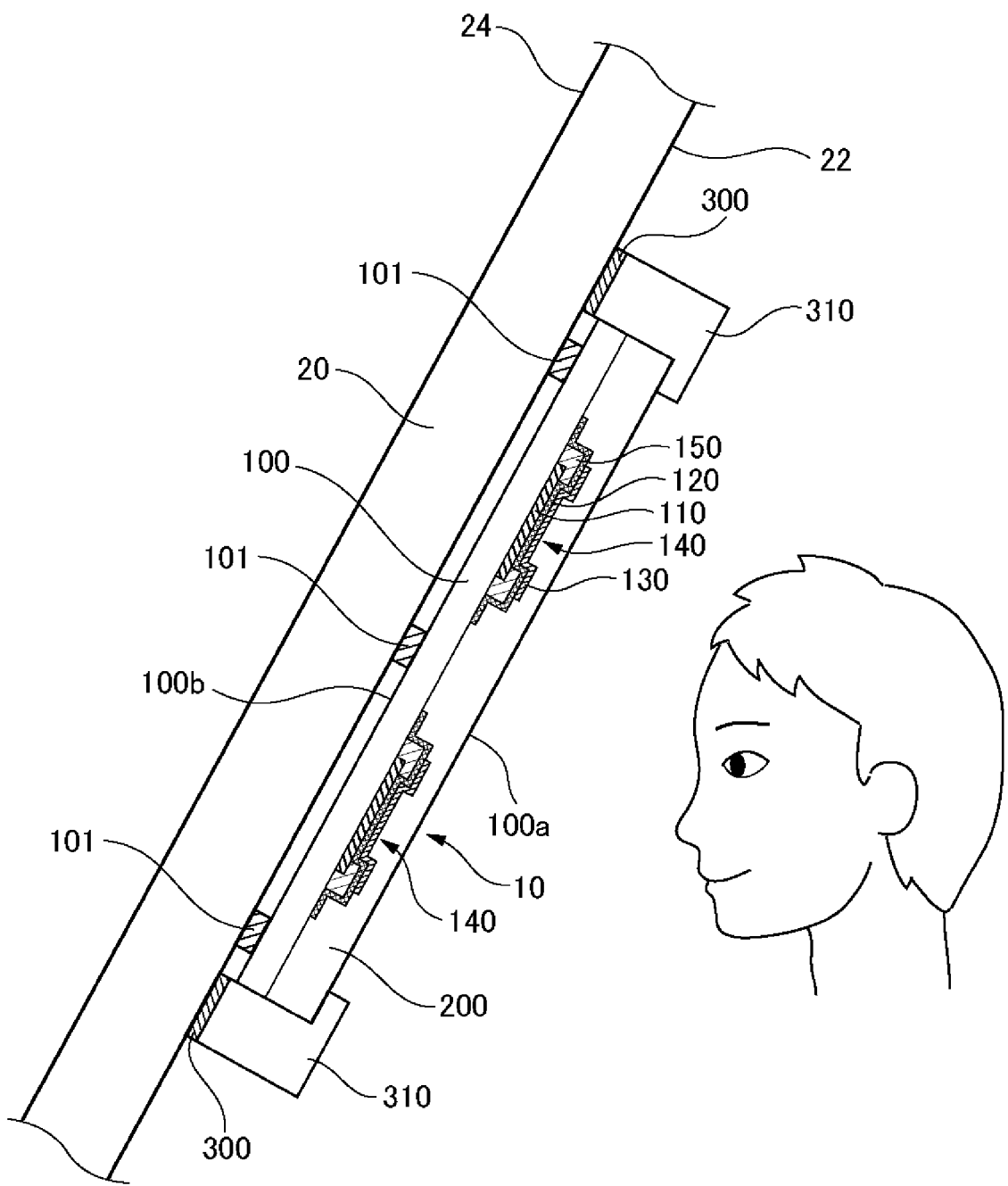
FIG. 9 is a cross-sectional view of a configuration example of a light-emitting system according to Modification Example 3.

FIG. 9 is a cross-sectional view of a configuration example of a light-emitting system according to Modification Example 3. The light-emitting system according to the present modification example has the same configuration as that of the light-emitting system according to Modification Example 1, except that the light-emitting device 10 is fixed to a partition member 20 using fixing members 310.

The fixing member 310 is a frame-like member with a lower surface thereof fixed to the partition member 20 using an adhesive layer 300. An upper portion of the fixing member 310 is bent toward the inside thereof, and this bent portion holds an edge of the light-emitting device 10. However, the shape of the fixing member 310 is not limited to the example shown in the drawing.

In the present modification example, a convex portion 101 is provided on a second surface 100b of the light-emitting device 10 to surround a light-emitting unit 140 when viewed from a direction perpendicular to the substrate 100. Therefore, an air gap is formed between the substrate 100 and a first surface 22 in a region overlapped with the light-emitting unit 140 when viewed from a direction perpendicular to the substrate. The convex portion 101 is formed, for example, of a resin material. Even in such a case, d/2≤W is established in the light-emitting device 10 between the thickness d of the substrate 100 and the width W of an overlapping region, thereby further reflecting reflected light from a surface of the substrate 100 on the second electrode 130 to a side of the substrate 100. Thus, it is possible to reduce light leaked from the rear surface.

Figure 10:
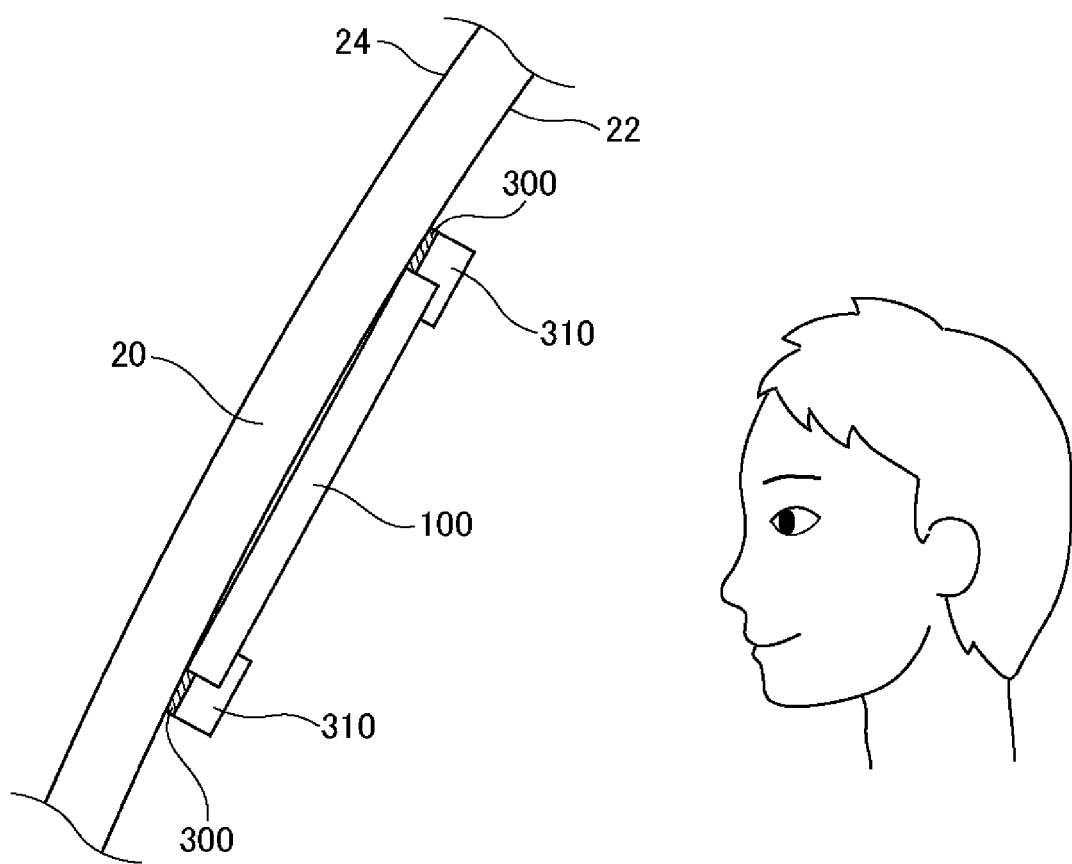
FIG. 10 is a cross-sectional view of another configuration example of a light-emitting system according to Modification Example 3.

FIG. 10 is a cross-sectional view of another configuration example of a light-emitting system according to Modification Example 3. As illustrated in the present drawing, there is a case where the partition member 20 is curved in a direction projecting to the outside of the mobile object 30. In such a case, it is difficult to directly fix the flat plate-like light-emitting device 10 on the inner surface (the first surface 22) of the partition member 20. However, when the fixing member 310 is used, even in such a case, the light-emitting device 10 can be fixed on the first surface 22. Meanwhile, the convex portion 101 illustrated in FIG. 9 may or may not be provided on the substrate 100.

In a case where a curved partition member 20 and the flat plate-like light-emitting device 10 are fixed by the above method, an air gap is formed between the substrate 100 and the first surface 22. Even in such a case, d/2≤W is established in the light-emitting device 10 between the thickness d of the substrate 100 and the width W in an overlapping region, thereby further reflecting reflected light from the surface of the substrate 100 on the second electrode 130 to the side of the substrate 100. Thus, it is possible to reduce the light leaked from the rear surface.

Modification Example 4

Figure 11:
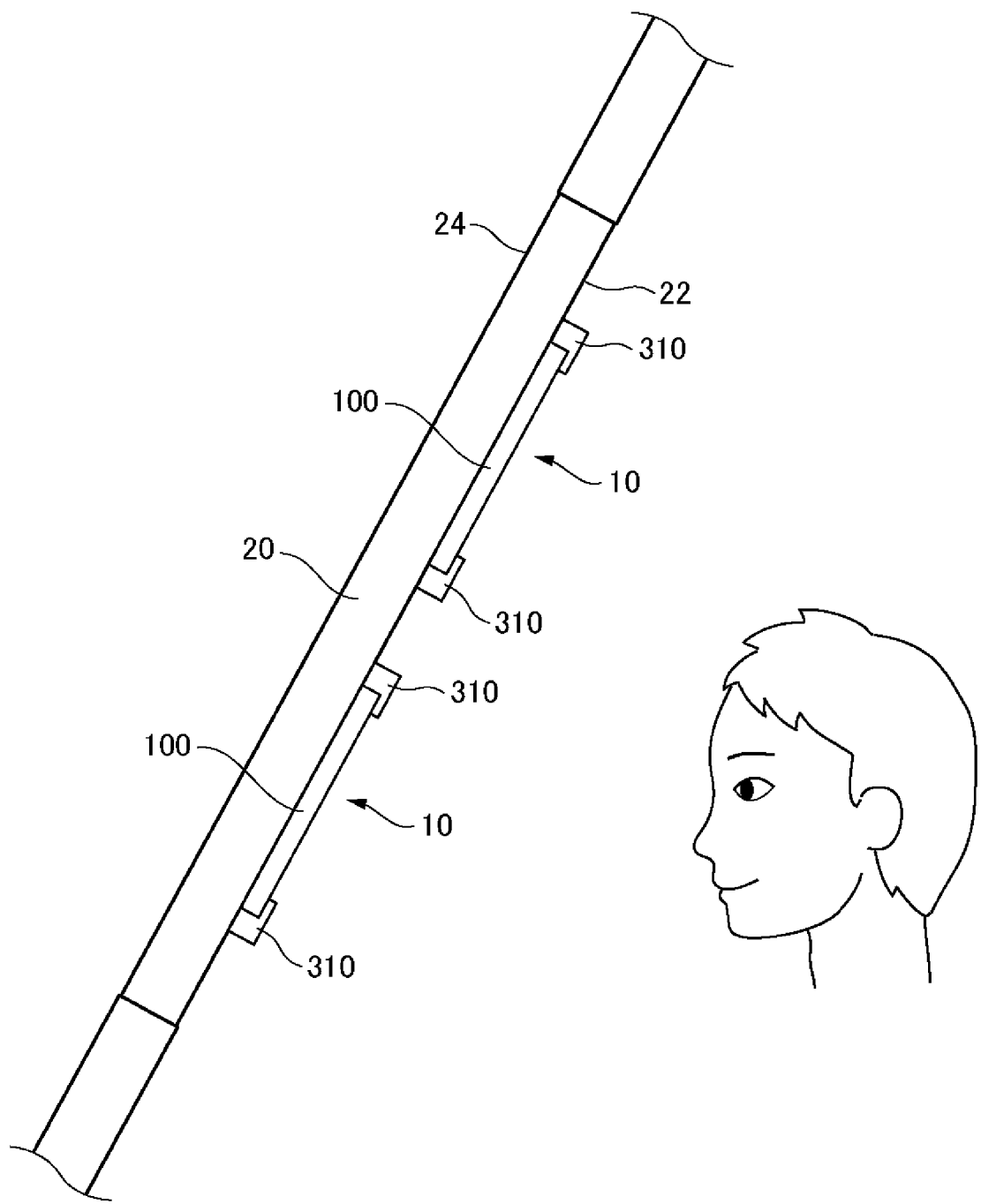
FIG. 11 is a cross-sectional view of a configuration example of a light-emitting system according to Modification Example 4.

FIG. 11 is a cross-sectional view of a configuration example of a light-emitting system according to Modification Example 4. The light-emitting system according to the present modification example has the same configuration as that of the light-emitting system according to the modification examples 1 to 3, except that a plurality of light-emitting devices 10 are installed on the partition member 20. Meanwhile, in FIG. 11, the example corresponding to FIG. 9 is illustrated in a simplified way. Turning on and off of the lights of the plurality of light-emitting devices 10 may be controlled in accordance with control signals that are the same or different from each other.

According to the present modification example, the same as the embodiment, it is possible to reduce light leaked from a rear surface.

Modification Example 5

Figure 12:
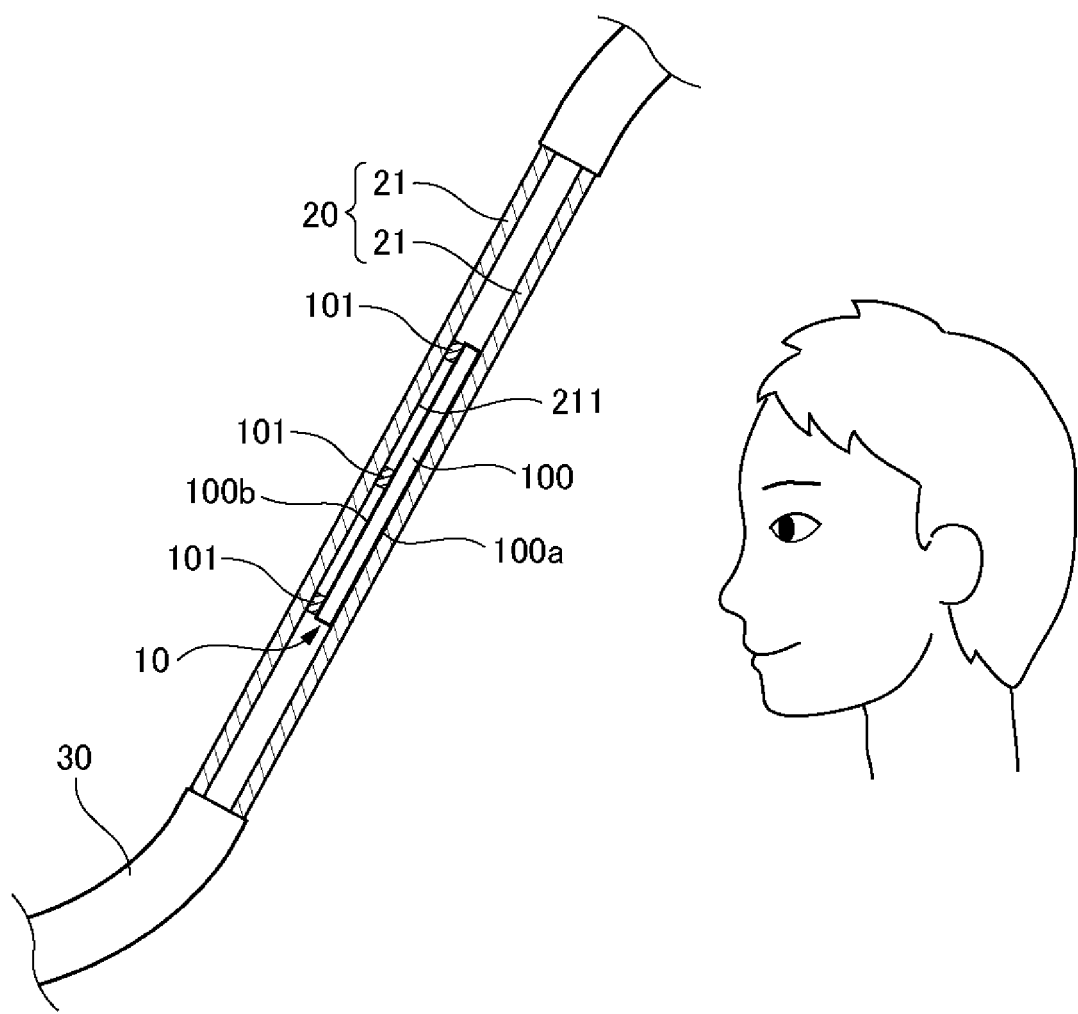
FIG. 12 is a cross-sectional view of a configuration example of a light-emitting system according to Modification Example 5.

FIG. 12 is a cross-sectional view of a configuration example of a light-emitting system according to Modification Example 5. The light-emitting system according to the present modification example has the same configuration as that of the light-emitting system according to Modification Example 1, except for the configuration of the partition member 20 and the position of the light-emitting device 10.

In the present modification example, the partition member 20 has a configuration in which a plurality of light-transmitting members 21 (for example, glass plates or resin plates) overlap each other. Further, the light-emitting device 10 is installed on the partition member 20 by being interposed between the light-transmitting members 21 next to each other.

In the present modification example, a convex portion 101 is provided on the second surface 100b of the light-emitting device 10 to surround the light-emitting unit 140 when viewed from a direction perpendicular to the substrate 100. Therefore, an air gap is formed between the substrate 100 and a surface 211 of the light-transmitting member 21 which faces the substrate 100 in a region overlapped with the light-emitting unit 140 when viewed from a direction perpendicular to the substrate. Even in such a case, d/2≤W is established in the light-emitting device 10 between the thickness d of the substrate 100 and the width W in an overlapping region, thereby further reflecting reflected light from a surface of the substrate 100 on the second electrode 130 to a side of the substrate 100. Thus, it is possible to reduce light leaked from a rear surface.

Example

A light-emitting device was manufactured as illustrated in FIG. 3 as follows. Specifically, first, a polyimide sheet provided with a barrier film was prepared as a substrate. Here, a refractive index of the polyimide sheet was 1.6, and the thickness of the substrate including the barrier film was 20 μm. Next, a light-emitting unit was formed on the substrate. The width W of an overlapping region was 20 μm. The formed light-emitting unit was covered by a sealing film, and then a sealing member having a barrier film formed thereon was fixed to the light-emitting unit with an adhesive.

Comparative Example

Except that a glass plate having a refractive index of 1.5 and the thickness of 700 μm was used as a substrate, a light-emitting device was manufactured the same as the Example.

Figure 13:
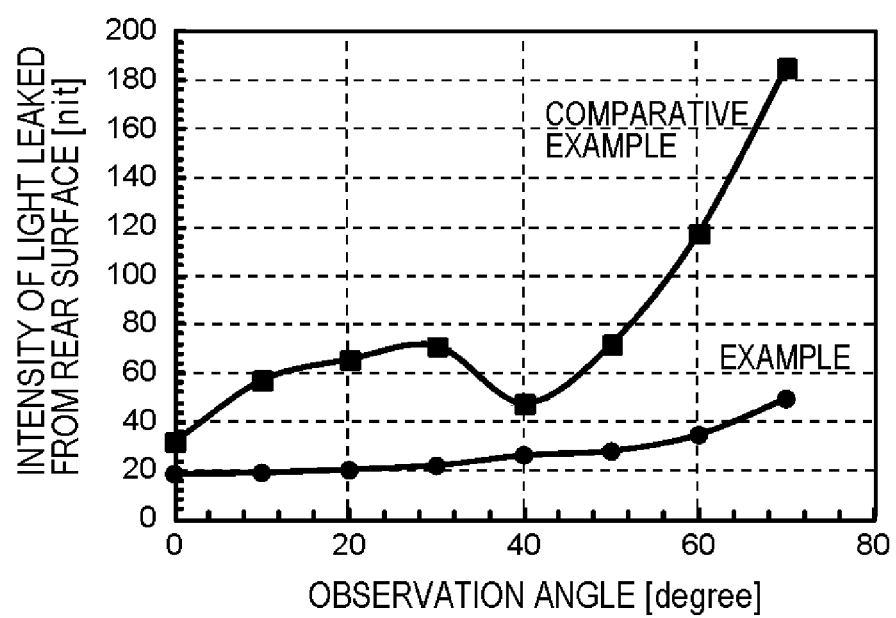
FIG. 13 is a diagram of a measured result of a relationship between observation angles and intensities of light leaked to the rear surface in a light-emitting device according to an example and a comparative example.

FIG. 13 is a chart which shows a result of measurement of a relationship between observation angles and intensities of light leaked to the rear surface in the light-emitting device according to the Example and Comparative Example. In the chart, the observation angle when viewing the rear surface side directly from a direction perpendicular to the substrate is set to 0 degrees, and an inclination angle from that direction is shown as the observation angle. Meanwhile, for measurements, the intensity of light-emission on the front surface side was set the same in the Example and the Comparative Example.

According to the result shown by the chart, a decrease in leakage of intensity of light from the rear surface was observed more in Example than Comparative Example at all observation angles.

The embodiment and the examples are described above referring to the drawings, but these are examples of the present invention and various configurations other than those described above can be employed.

The invention claimed is:

1. A light-emitting device comprising:
a light-transmitting substrate;
a plurality of light-emitting units formed on the substrate, each light-emitting unit comprising a light-transmitting first electrode, a light-reflective second electrode, and an organic layer located between the first electrode and the second electrode;
a light-transmitting region located between the plurality of light-emitting units; and an insulating film that defines an end of the light-emitting unit, wherein a sealing member is fixed to the light-emitting unit directly or through an adhesive layer, and wherein when a thickness of the substrate is d and a width of a portion of the second electrode that is further on the outer side of the light-emitting unit than the end is W, $d/2 \leq W$ is established.

2. The light-emitting device according to claim 1, wherein the plurality of light-emitting units extend in a same direction when viewed from a direction perpendicular to the substrate.

3. The light-emitting device according to claim 1, wherein the thickness d of the substrate is equal to or less than 100 μm.

4. The light-emitting device according to claim 1, wherein when a refractive index of the substrate is n, $d \times \tan(\arcsin(1/n)) \leq W < 3d \times \tan(\arcsin(1/n))$ is satisfied.

5. The light-emitting device according to claim 4, wherein $2d \times \tan(\arcsin(1/n)) \leq W < 3d \times \tan(\arcsin(1/n))$ is satisfied.

6. The light-emitting device according to claim 4, wherein the substrate comprises a plurality of layers, and the refractive index is a refractive index of the thickest layer of the plurality of layers.

7. The light-emitting device according to claim 4, wherein the substrate comprises a plurality of layers, and the refractive index is a mean value of refractive indexes of the plurality of layers.

8. The light-emitting device according to claim 1, further comprising a covering film that directly covers the light-emitting unit, the insulating film, and the substrate in the light-transmitting region.

9. A light-emitting system comprising:

a light-transmitting partition member that partitions a space from an exterior;

a light-transmitting substrate disposed on the partition member;

a plurality of light-emitting units formed on one surface of the substrate, each light-emitting unit comprising a light-transmitting first electrode, a light-reflective second electrode, and an organic layer located between the first electrode and the second electrode;

a light-transmitting region located between the plurality of light-emitting units;

an insulating film that defines an end of the light-emitting unit; and a covering film that directly covers the light-emitting unit, the insulating film, and the substrate in the light-transmitting region, wherein when a thickness of the substrate is d, and a width of a portion of the second electrode that is further on the outer side of the light-emitting unit than the end is W, $d/2 \leq W$ is established.

* * * * *